(12) United States Patent
Kim et al.

(10) Patent No.: US 7,700,426 B2
(45) Date of Patent: Apr. 20, 2010

(54) NONVOLATILE MEMORY DEVICE AND METHOD OF FORMING THE SAME

(75) Inventors: Tae-Kyung Kim, Seoul (KR);
Sung-Nam Chang, Seoul (KR);
Dong-Seog Eun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 137 days.

(21) Appl. No.: 11/699,112

(22) Filed: Jan. 29, 2007

(65) Prior Publication Data

US 2008/0093650 A1    Apr. 24, 2008

(30) Foreign Application Priority Data

Oct. 20, 2006    (KR) ..................... 10-2006-0102568

(51) Int. Cl.
*H01L 21/8238*    (2006.01)

(52) U.S. Cl. .................. 438/201; 438/211; 438/257; 257/315; 257/E21.654

(58) Field of Classification Search ............... 257/315, 257/E21.654; 438/201, 211, 257
See application file for complete search history.

(56) References Cited

U.S. PATENT DOCUMENTS

| | | | | |
|---|---|---|---|---|
| 6,157,568 A | * | 12/2000 | Schmidt | 365/185.1 |
| 6,255,155 B1 | * | 7/2001 | Lee et al. | 438/222 |
| 6,362,050 B2 | | 3/2002 | Kalnitsky et al. | |
| 6,815,283 B2 | | 11/2004 | Lee | |
| 6,828,194 B2 | * | 12/2004 | Chan et al. | 438/257 |
| 7,183,599 B2 | | 2/2007 | Lee | |
| 7,256,459 B2 | * | 8/2007 | Shino | 257/347 |
| 2004/0178456 A1 | * | 9/2004 | Park et al. | 257/390 |
| 2005/0142765 A1 | * | 6/2005 | Joo | 438/264 |
| 2005/0164457 A1 | * | 7/2005 | Kim et al. | 438/287 |
| 2006/0151817 A1 | | 7/2006 | Lee | |
| 2009/0242996 A1 | * | 10/2009 | van Bentum et al. | 257/369 |

FOREIGN PATENT DOCUMENTS

| | | | |
|---|---|---|---|
| KR | 2003-0002721 | | 1/2003 |
| KR | 1020040093903 | | 11/2004 |
| KR | 10-2006-0007177 | | 1/2006 |
| KR | 1020060076506 A | * | 4/2006 |
| KR | 10-2006-0076506 | | 7/2006 |
| KR | 1020060102193 | | 9/2006 |

* cited by examiner

*Primary Examiner*—Thao X Le
*Assistant Examiner*—Eric W Jones
(74) *Attorney, Agent, or Firm*—Mills & Onello, LLP (57) ABSTRACT

Provided is a nonvolatile memory device and a method of forming the nonvolatile memory device. The nonvolatile memory device includes a floating gate formed on a first active region doped with a first-conductivity-type dopant. The floating gate is doped with the first-conductivity-type dopant. Therefore, the thickness of a tunnel insulation layer can be kept thin, and the threshold voltage of a nonvolatile memory cell including the floating gate can be increased. As a result, the endurance of the tunnel insulation layer and the data retention characteristics of the nonvolatile memory cell is improved.

13 Claims, 9 Drawing Sheets

NONVOLATILE MEMORY DEVICE AND METHOD OF FORMING THE SAME

CROSS-REFERENCE TO RELATED APPLICATIONS

This U.S. non-provisional patent application claims priority under 35 U.S.C. §119 of Korean Patent Application No. 10-2006-102568, filed in the Korean Intellectual Property Office on Oct. 20, 2006, the entire contents of which are hereby incorporated by reference.

BACKGROUND OF THE INVENTION

The present invention relates to a semiconductor device and a method of forming the semiconductor device, and more particularly, to a nonvolatile memory device and a method of forming the nonvolatile memory device.

Nonvolatile memory devices retain data when power is removed from the system. One type of nonvolatile memory device is a flash memory device used for electrically recording and erasing date. In a conventional flash memory device, a unit cell includes a tunnel oxide layer, a floating gate, an oxide-nitride-oxide (ONO) layer, and a control gate electrode that are sequentially stacked. The flash memory cell can store one-bit data (logic 0 or 1) by electrically charging or discharging the floating gate.

In the flash memory device, electrons should be kept in the floating gate for a long time for good data retention characteristics of the flash memory device, and the endurance of the tunnel oxide layer should be good for normal functioning of the flash memory device after a number of recording and erasing operations.

According to a conventional method for improving the data retention characteristics of a flash memory device, the thickness of the tunnel oxide layer is increased. In this case, the threshold voltage of the flash memory cell increases, and thus the data retention characteristics of the flash memory device can be improved. Due to iterative recording and erasing operations, traps can be present in the tunnel oxide layer. The traps can capture electrons tunneling the tunnel oxide layer during the recording or erasing operation. This can degrade the endurance of the tunnel oxide layer. The possibility of trapping in the tunnel oxide layer increases in proportion to the thickness of the tunnel oxide layer. That is, when the thickness of the tunnel oxide layer is increased for improving the data retention characteristics of the flash memory cell, the endurance of the tunnel oxide layer can be degraded since the number of traps increases. In particular, as the number of traps increases, the heat-resistive characteristics (heat stress characteristics) of the flash memory device can be degraded. The heat stress characteristics are related to an upper temperature limit above which the flash memory device cannot normally operate. For example, when the flash memory device is heated to a high temperature (thermally stressed), electrons captured by the traps are released to the outside of the tunnel oxide layer (i.e., the more traps the more released electrons), changing the threshold voltage of the flash memory cell. As a result, the characteristics of the flash memory device are degraded.

SUMMARY OF THE INVENTION

The present invention provides a nonvolatile memory device having good data retention characteristics and endurance, and a method of forming the nonvolatile memory device.

The present invention also provides a nonvolatile memory device having good data retention characteristics, endurance, and optimized transistors, and a method of forming the nonvolatile memory device.

According to a first aspect, the present invention is directed to a nonvolatile memory device including: a first active region defined in a first region of a substrate and doped with a first-conductivity-type dopant; a tunnel insulation layer, a floating gate, a blocking insulation pattern, and a control gate electrode that are sequentially stacked on the first active region; a second active region defined in a second region of the substrate and doped with the first-conductivity-type dopant; a gate insulation layer, a lower gate, and an upper gate that are sequentially stacked on the second active region; and an inter-gate pattern interposed between the lower gate and the upper gate. The upper gate is connected to the lower gate via an opening formed through the inter-gate pattern, the floating gate is formed of a semiconductor doped with the first-conductivity-type dopant, and the lower gate is formed of a semiconductor doped with a second-conductivity-type dopant.

In some embodiments, the first-conductivity-type dopant is a p-type dopant, and the second-conductivity-type dopant is an n-type dopant.

In some embodiments, the nonvolatile memory device further includes: a first diffusion barrier pattern interposed between the blocking insulation pattern and the control gate electrode; and a second diffusion barrier pattern interposed between a top surface of the inter-gate pattern and the upper gate.

In some embodiments, the tunnel insulation layer, the floating gate, the blocking insulation pattern, and the control gate electrode are included in a cell gate pattern. Here, a plurality of the cell gate patterns may be arranged side by side at regular intervals on the first active region. In this case, the second active region may be connected to one side of the first active region to form a string active region together with the first active region, and the gate insulation layer, the lower gate, and the upper gate may be included in a selection gate pattern. The nonvolatile memory device may further include dopant doped regions formed in the string active region at both sides of the cell gate pattern and the selection gate pattern. The dopant doped regions may be doped with the second-conductivity-type dopant. In this case, the control gate electrode may include a lower portion formed of a semiconductor doped with the first-conductivity-type dopant, and the upper gate may include a lower portion formed of a semiconductor doped with the second-conductivity-type dopant. Alternatively, a lower portion of the control gate electrode and a lower portion of the upper gate may be formed of semiconductors doped with the second-conductivity-type dopant.

In come embodiments, the first region is a region for a nonvolatile memory cell and the second region is a region for a peripheral circuit transistor. In this case, the nonvolatile memory device may further include: a third active region defined in a third region of the substrate and doped with the first-conductivity-type dopant, the third active region being connected to one side of the first active region; a selection gate insulation layer, a selection lower gate, and a selection upper gate that are sequentially stacked on the third active region; and a selection inter-gate pattern interposed between the selection lower gate and the selection upper gate. Here, the first and third active regions may form a string active region, and the selection upper gate may be connected to the selection lower gate via a selection opening formed through the selection inter-gate pattern. In this case, the selection lower gate may be formed of a semiconductor doped with the first-conductivity-type dopant. Alternatively, the selection lower gate may be formed of a semiconductor doped with the second-conductivity-type dopant. In some embodiments, the nonvolatile memory device may further include: a first dopant doped region formed in the string active region at both sides of the control gate electrode and the selection upper gate, and doped with the second-conductivity-type dopant; and a second dopant doped region formed in the second active region at both sides of the upper gate and doped with the second-conductivity-type dopant.

In some embodiments, the nonvolatile memory device further comprises: a first diffusion barrier pattern interposed between the blocking insulation pattern and the control gate electrode; a second diffusion barrier pattern formed in the second region between a top surface of the inter-gate pattern and the upper gate; and a third diffusion barrier pattern formed in the third region between a top surface of the selection inter-gate pattern and the selection upper gate.

According to another aspect, the present invention is directed to a method of forming a nonvolatile memory device, the method comprising: defining first and second active regions respectively in first and second regions of a substrate, the first and second active regions doped with a first-conductivity-type dopant; forming a first insulation layer and a first semiconductor pattern stacked on the first active region, and a second insulation layer and a second semiconductor pattern stacked on the second active region, the first semiconductor pattern being doped with the first-conductivity-type dopant, the second semiconductor pattern being doped with the first-conductivity-type dopant; forming a blocking insulation layer on a surface of the substrate; patterning the blocking insulation layer to form an opening exposing the second semiconductor pattern; counter doping a portion of the second semiconductor pattern with a second-conductivity-type dopant through the opening; forming a control gate conductive layer so as to cover the surface of the substrate and fill the opening; and forming a floating gate, a blocking insulation pattern, and a control gate electrode stacked on the first active region, and a lower gate, an inter-gate pattern having the opening, and an upper gate stacked on the second active region. The floating gate is formed from a portion of the first semiconductor pattern, and the lower gate is formed from the portion of the second semiconductor pattern counter doped with the second-conductivity-type dopant.

In some embodiments, the first-conductivity-type dopant is a p-type dopant, and the second-conductivity-type dopant is an n-type dopant. The method may further include forming a diffusion barrier layer on the blocking insulation layer prior to the patterning of the blocking insulation layer. In this case, the opening may pass through the diffusion barrier layer and the blocking insulation layer.

In some embodiments, the counter doping and the forming of the control gate conductive layer includes: injecting a second-conductivity-type dopant into a portion of the second semiconductor pattern exposed by the opening to perform the counter doping; and forming a control gate conductive layer on a surface of the substrate, the control gate conductive layer contacting the counter-doped portion of the second semiconductor pattern through the opening. Here, the second-conductivity-type dopant may be injected using one of ion-implantation, plasma doping, and thermal decomposition/diffusion. The thermal decomposition/diffusion may be performed by thermally decomposing and diffusing gas containing a dopant.

In some embodiments, the counter doping and the forming of the control gate conductive layer include: forming a control gate semiconductor layer doped with the first-conductivity-type dopant to cover a surface of the substrate and fill the opening; forming a mask pattern on the control gate semiconductor layer, the mask pattern covering a portion of the control gate semiconductor layer located on the first active region and exposing another portion of the control gate semiconductor layer located in the second region of the substrate; and counter doping the exposed portion of the control gate semiconductor layer and a portion of the second semiconductor pattern located under the opening with the second-conductivity-type dopant using the mask pattern as a mask. In this case, the second-conductivity-type dopant may be injected using one of ion-implantation, plasma doping, and thermal decomposition/diffusion. The thermal decomposition/diffusion may be performed by thermally decomposing and diffusing gas containing a dopant.

In some embodiments, the counter doping and the forming of the control gate conductive layer include: forming a control gate semiconductor layer on a surface of the substrate, the control gate semiconductor layer being doped with the second-conductivity-type dopant and making contact with the second semiconductor pattern through the opening; and heat treating the substrate to diffuse the second-conductivity-type dopant from the control gate semiconductor layer to the second semiconductor pattern through the opening so as to counter dope the second semiconductor pattern.

In some embodiments, the patterning of the blocking insulation layer to form the opening includes: forming a mask layer including first and second layers that are sequentially stacked on the blocking insulation layer; and sequentially patterning the mask layer and the blocking insulation layer so as to form an opening. The first layer of the mask layer may be a semiconductor layer, and the control gate electrode and the upper gate may include portions of the first layer of the mask layer, respectively.

In some embodiments, the second active region is connected to one side of the first active region to form a string active region together with the first active region. In this case, the first and second insulation layers may be transversely connected with each other, the first and second semiconductor patterns may be transversely connected with each other, and the floating gate, the blocking insulation pattern, and the control gate electrode may be included in a cell gate pattern. Further, a plurality of the cell gate patterns may be formed side by side at regular intervals on the first active region, and the lower gate and the upper gate may be included in a selection gate pattern.

In some embodiments, the first region is a region for nonvolatile memory cells, and the second region is a region for a peripheral circuit transistor. In this case, the method may further include: defining a third active region in a third region of the substrate, the third active region being connected to one side of the first active region; and forming a selection gate insulation layer, a selection lower gate, a selection inter-gate pattern having a selection opening, and a selection upper gate that are sequentially stacked on the third active region. The first and third active regions may form a string active region, and the selection upper gate may be connected to the lower gate through the selection opening. In this case, the selection lower gate may be formed of a semiconductor doped with the first-conductivity-type dopant. Alternatively, the selection lower gate may be formed of a semiconductor doped with the second-conductivity-type dopant. In some embodiments, the method further includes implanting second-conductivity-type dopant ions into the string active region using the control gate electrode and the selection upper gate as a mask; and implanting second-conductivity-type dopant ions into the second active region using the upper gate of the second region as a mask.

BRIEF DESCRIPTION OF THE FIGURES

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 1:
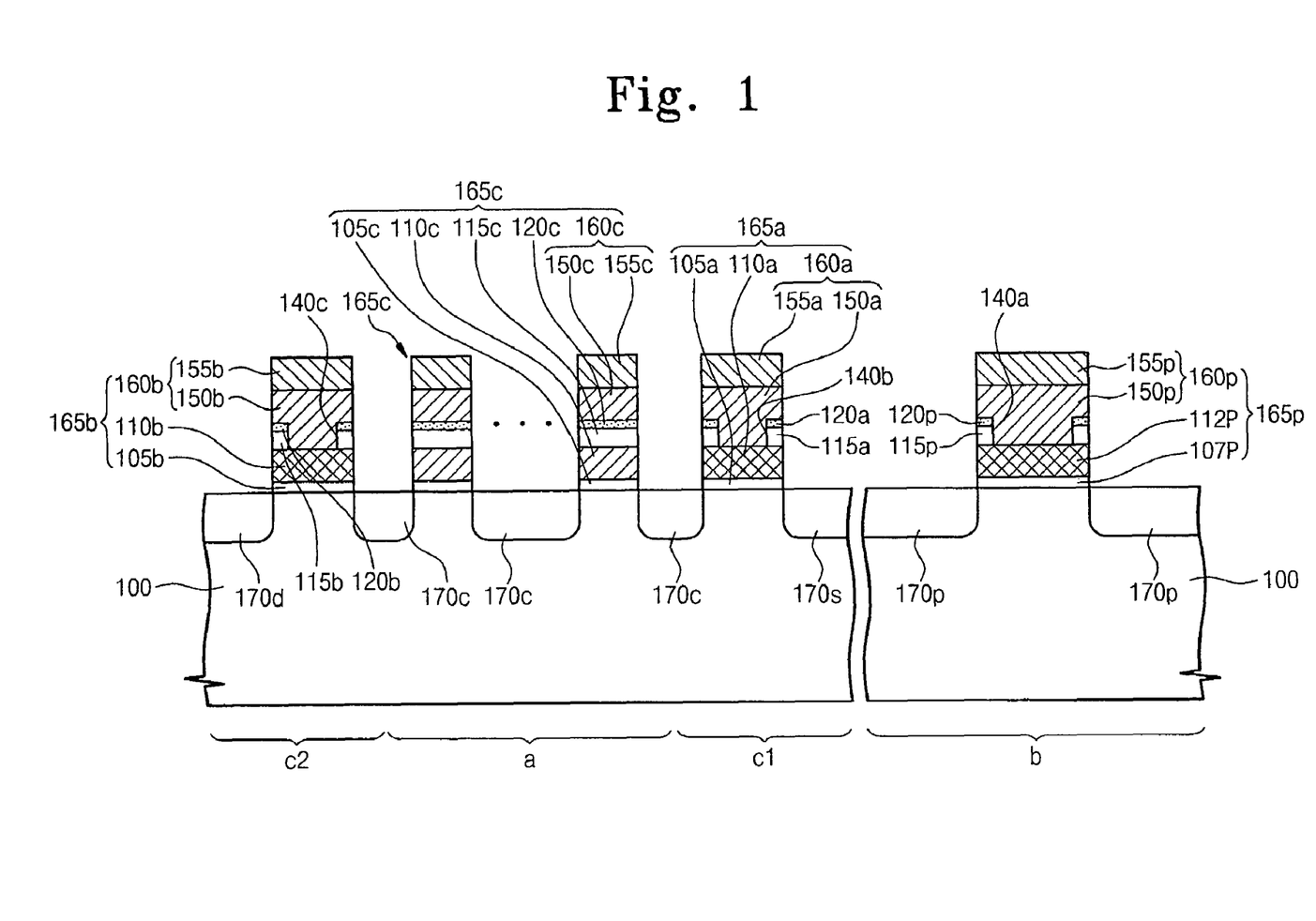
FIG. 1 is a partial cross-sectional view illustrating a nonvolatile memory device according to an embodiment of the present invention.

FIG. 1 is a partial cross-sectional view illustrating a nonvolatile memory device according to an embodiment of the present invention.

Referring to FIG. 1, a semiconductor substrate 100 (hereinafter, referred to as a substrate 100) includes a cell string region and a peripheral region (b). The substrate 100 may be a silicon substrate. The cell string region includes a cell region (a) and first and second selection regions (c1) and (c2). The first and second selection regions (c1) and (c2) are disposed at both side of the cell region (a), respectively. The peripheral region (b) is a region for a peripheral circuit transistor, and the cell string region is a region for a cell string of a NAND type nonvolatile memory device. In detail, the cell region (a) is a region for a plurality of nonvolatile memory cells connected in series, and the first and second selection regions (c1) and (c2) are regions for first and second selection transistors, respectively. A device isolation layer (not shown) is formed on the substrate 100 to define a string active region in the cell string region and a peripheral active region in the peripheral region (b). The string active region includes a cell active region located in the cell region (a), and first and second selection active regions located respectively in the first and second selection regions (c1) and (c2). The first and second selection active regions are connected to both sides of the cell active region. The string active region and the peripheral active region are portions of the substrate 100 surrounded by the device isolation layer. The string active region and the peripheral active region are doped with a first-conductivity-type dopant, that is, a dopant of a first conductivity type, i.e., n-type or p-type.

A plurality of cell gate patterns 165c are arranged at regular intervals on the cell active region. A first section gate pattern 165a is formed on the first selection active region, and a second selection gate pattern 165b is formed on the second selection active region. The first and second selection gate patterns 165a and 165b are spaced apart from the cell gate patterns 165c. The first and second gate patterns 165a and 165b and the cell gate patterns 165c can form parallel lines. A peripheral gate pattern 165p is formed on the peripheral active region.

First dopant doped regions 170c, 170s, and 170d are formed in the string active region at both sides of the cell gate patterns 165c, the first selection gate pattern 165a, and the second selection gate pattern 165b. The first dopant doped regions 170c formed at both sides of the cell gate patterns 165c correspond to cell source/drain regions. The first dopant doped region 170s formed a side of the first gate pattern 165a corresponds to a common source region 170s, and the first dopant doped region 170d formed a side of the second selection gate pattern 165b corresponds to a common drain region. The cell gate patterns 165c, the first selection gate pattern 165a, the second selection gate pattern 165b, and the cell source/drain regions 170c are formed in the string active region between the common source region 170s and the common drain region 170d. The first dopant doped regions 170c, 170s, and 170d are doped with a second-conductivity-type dopant different from the first-conductivity-type dopant used for doping the string active region. Second dopant doped regions 170p are formed in the peripheral active region at both sides of the peripheral gate pattern 165p. The second dopant doped regions 170p correspond to source/drain regions of the peripheral circuit transistor.

Each of the cell gate patterns 165c includes a tunnel insulation layer 105c, a floating gate 110c, a blocking insulation pattern 115c, a cell diffusion barrier pattern 120c, and a control gate electrode 160c that are sequentially stacked. The control gate electrode 160c can include a first pattern 150c and a second pattern 155c that are sequentially stacked. The first selection gate pattern 165a includes a first selection gate insulation layer 105a, a first selection lower gate 110a, and a first selection upper gate 160a that are sequentially stacked. The first selection upper gate 160a can include a first pattern 150a and a second pattern 155a that are sequentially stacked. The second selection gate pattern 165b includes a second selection gate insulation layer 105b, a second selection lower gate 110b, and a second selection upper gate 160b that are sequentially stacked. The second selection upper gate 160b can include a first pattern 150b and a second pattern 155b that are sequentially stacked. The peripheral gate pattern 165p includes a peripheral gate insulation layer 107p, a peripheral lower gate 112p, and a peripheral upper gate 160p that are sequentially stacked. The peripheral upper gate 160p can include a first pattern 150p and a second pattern 155p that are sequentially stacked. The first patterns 150*c*, 150*a*, 150*b*, and 150*p* of the control gate electrode 160*c*, the first selection upper gate 160*a*, the second selection upper gate 160*b*, and the peripheral upper gate 160*p* are formed of a doped semiconductor. For example, the patterns 150*c*, 150*a*, 150*b*, and 150*p* can be formed of doped polysilicon. The second patterns 155*c*, 155*a*, 155*b*, and 155*p* of the control gate electrode 160*c*, the first selection upper gate 160*a*, the second selection upper gate 160*b*, and the peripheral upper gate 160*p* may be formed of a material having a specific resistance lower than that of the doped semiconductor of the first patterns 150*c*, 150*a*, 150*b*, and 150*p*.

A peripheral inter-gate pattern 115*p* is interposed between the peripheral lower gate 112*p* and the peripheral upper gate 160*p*. Here, the peripheral upper gate 160*p* makes contact with the peripheral lower gate 112*p* via a peripheral opening 140*a* formed through the peripheral inter-gate pattern 115*p*. A peripheral diffusion barrier pattern 120*p* can be formed between a top surface of the peripheral inter-gate pattern 115*p* and the peripheral upper gate 160*p*. In this case, the peripheral opening 140*a* penetrates the peripheral diffusion barrier pattern 120*p*.

A first selection inter-gate pattern 115*a* is interposed between the first selection lower gate 110*a* and the first selection upper gate 160*a*, and a second selection inter-gate pattern 115*b* is interposed between the second selection lower gate 110*b* and the second selection upper gate 160*b*. The first selection upper gate 160*a* makes contact with the first selection lower gate 110*a* via a first selection opening 140 formed through the first selection inter-gate pattern 115*a*, and the second selection upper gate 160*b* makes contact with the second selection lower gate 110*b* via a second selection opening 140*c* formed through the second selection inter-gate pattern 115*b*. A first selection diffusion barrier pattern 120*a* can be interposed between a top surface of the first inter-gate pattern 115*a* and the first selection upper gate 160*a*, and a second selection diffusion barrier pattern 120*b* can be interposed between a top surface of the second inter-gate pattern 115*b* and the second selection upper gate 160*b*. In this case, the first selection openings 140*a* and 140*b* penetrate the first and second diffusion barrier patterns 120*a* and 120*b*, respectively.

The tunnel insulation layer 105*c* can be formed of an oxide layer (in particular, a thermal oxide layer). The first and second selection gate insulation layers 105*a* and 105*b* can be formed of the same material as the tunnel insulation layer 105*c*. The first and second selection gate insulation layers 105*a* and 105*b* can have the same thickness as the tunnel insulation layer 105*c*. Alternatively, the first and second selection gate insulation layers 105*a* and 105*b* can have a thickness different from that of the tunnel insulation layer 105*c*. The peripheral gate insulation layer 107*p* can be formed of an oxide layer (in particular, a thermal oxide layer). The peripheral gate insulation layer 107*p* can have the same thickness as the tunnel insulation layer 105*c*. Alternatively, the peripheral gate insulation layer 107*p* can have a thickness different from that of the tunnel insulation layer 105*c*.

The floating gate 110*c*, the first selection lower gate 110*a*, the second selection lower gate 110*b*, and the peripheral lower gate 112*p* may be formed of a dopant doped semiconductor. For example, the floating gate 110*c*, the first selection lower gate 110*a*, the second selection lower gate 110*b*, and the peripheral lower gate 112*p* may be formed of dopant doped polysilicon.

The floating gate 110*c* may be formed of a semiconductor doped with a first-conductivity-type dopant. That is, the floating gate 110*c* may be doped with the same type of dopant as the dopant used for doping the cell active region (a cell channel region) located under the floating gate 110*c*. The first conductive dopant may be a p-type dopant, and the second conductive dopant may be an n-type dopant. In this case, electrons can penetrate the tunnel insulation layer 105*c* to the floating gate 110*c* by tunneling. Alternatively, the first conductive dopant can be an n-type dopant, and the second conductive dopant can be a p-type dopant. In this case, holes can penetrate the tunnel insulation layer 105*c* to the floating gate 110*c* by tunneling.

Since the floating gate 110*c* is doped with the same type of dopant as the dopant used for doping the cell channel region, the threshold voltage of a nonvolatile memory cell having the floating gate 110*c* can be high as compared with the threshold voltage of a conventional volatile memory cell having a floating gate formed above a p-type substrate using an n-type polysilicon. That is, the threshold voltage of a nonvolatile memory cell can be increased using the floating gate 110*c*. As a result, the thickness of the tunnel insulation layer 105*c* can be kept thin, and as well, the data retention characteristics of the nonvolatile memory cell can be improved. That is, the possibility of trapping in the tunnel insulation layer 105*c* can be reduced by making the tunnel insulation layer 105*c* thin. Thus, the endurance of the tunnel insulation layer 105*c* can be improved, and the nonvolatile memory cell using the floating gate 110*c* can have a high threshold voltage (i.e., the data retention characteristics of the nonvolatile memory cell can be improved). Accordingly, the nonvolatile memory cell can exhibit good characteristics at high temperatures as well as room temperature.

The peripheral lower gate 112*p* may be formed of a semiconductor doped with the second-conductivity-type dopant. That is, the peripheral lower gate 112*p* may be doped with a different type of dopant from the type of dopant used for doping the peripheral active region (a peripheral channel region) located under the peripheral lower gate 112*p*. As a result, the threshold voltage of the peripheral circuit transistor including the peripheral lower gate 112*p* can be kept at a low level owing to a work function difference between the peripheral lower gate 112*p* and the peripheral channel region. Therefore, the peripheral circuit transistor can operate at a high speed, thereby realizing a high-speed nonvolatile memory device. The first pattern 150*p* of the peripheral upper gate 160*p* connected to the peripheral lower gate 112*p* is doped with the same type of dopant as the peripheral lower gate 112*p*.

The first and second selection lower gates 110*a* and 110*b* may be formed of a semiconductor doped with the second-conductivity-type dopant. That is, the first and second selection lower gates 110*a* and 110*b* may be doped with a different type of dopant from the type of dopant used for doping first and second selection channel regions that are respectively located under the first and second selection lower gates 110*a* and 110*b*. As a result, the threshold voltages of the first and second selection transistors respectively including the first and second selection lower gates 110*a* and 110*b* can be kept at lower levels. Therefore, the first and second selection transistor can operate at a high speed, and thus the writing, erasing, and/or sensing operations of the cell strings of the nonvolatile memory device can be performed at a high speed. The first patterns 150*a* and 150*b* of the first and second selection upper gates 160*a* and 160*b* are doped with the same type of dopant as the first and second selection lower gates 110*a* and 110*b* (i.e., doped with the second-conductivity-type dopant).

Alternatively, the first and second selection lower gates 110*a* and 110*b* can be formed of a semiconductor doped with the first-conductivity-type dopant. That is, the first and second selection lower gates 110a and 110b can be doped with the type of dopant as the dopant used for doping the first and second selection channel regions that are respectively located under the first and second selection lower gates 110a and 110b. In this case, the threshold voltages of the first and second selection transistors may be determined by the thicknesses of the first and second gate insulation layers 105a and 105b and the amount of voltage increase cased by the first and second selection lower gates 110a and 110b. In this case, the first patterns 150a and 150b of the first and second selection upper gates 160a and 160b are doped with the same type of dopant as the first and second selection lower gates 110a and 110b (i.e., doped with the first-conductivity-type dopant).

The blocking insulation pattern 115c can be formed of an oxide layer or an oxide-nitride-oxide (ONO) layer to a thickness greater than the thickness of the tunnel insulation layer 105c. Alternatively, the blocking insulation layer can include a high-k dielectric layer (e.g., an insulation metal oxide layer such as a hafnium oxide layer or a aluminum oxide layer) having a high dielectric constant as compared with the tunnel insulation layer 105c. The peripheral inter-gate pattern 115p, the first selection inter-gate pattern 115a, and the second inter-gate pattern 115b may be formed of the same material as the blocking insulation pattern 115c.

The cell diffusion barrier pattern 120c may be formed of a material that can restrict dopant diffusion. For example, the cell diffusion barrier pattern 120c can be formed of a nitride layer or an oxide-nitride layer. The cell diffusion barrier pattern 120c can be omitted. In this case, the control gate electrode 160c is in direct contact with the blocking insulation pattern 115c. The peripheral diffusion barrier pattern 120p, the first selection diffusion barrier pattern 120a, and the second selection diffusion barrier pattern 120b may be formed of the same material as the cell diffusion barrier pattern 120c.

The first pattern 150c of the control gate electrode 160c may be formed of a semiconductor doped with the first-conductivity-type dopant. Alternatively, the first pattern 150c of the control gate electrode 160c can be formed of a semiconductor doped with the second-conductivity-type dopant.

As described above, the second patterns 155c, 155a, 155b, and 155p are formed of conductive materials having a low specific resistance as compared with the first patterns 150c, 150a, 150b, and 150p. Here, the second patterns 155c, 155a, 155b, and 155p may be formed of the same conductive material. For example, the second patterns 155c, 155a, 155b, and 155p can be formed of a metal, a conductive metal nitride, or metal silicide. For example, the second patterns 155c, 155a, 155b, and 155p can be formed of at least one material selected from the group consisting of tungsten, molybdenum, nitride tantalum, and tungsten silicide.

In the above-described nonvolatile memory device, the floating gate 110c is formed of a semiconductor doped with the same type of dopant as the dopant used for doping the cell active region forming the cell channel region. Thus, the threshold voltage of a nonvolatile memory cell including the floating gate 110c is increased. As a result, the endurance of the tunnel insulation layer 105c can be improved by keeping the thickness of the tunnel insulation layer 105c at a low level, and as well, the data retention characteristics of the nonvolatile memory cell can be improved, thereby realizing a nonvolatile memory device having good characteristics at a high temperature as well as at room temperature.

Furthermore, the peripheral lower gate 112p of the peripheral circuit transistor is formed of a semiconductor doped with a different type of dopant from the type of dopant used for doping the peripheral active region. Thus, the threshold voltage of the peripheral circuit transistor can be kept at a lower level for high-speed operations.

Moreover, the first and second selection lower gates 110a and 110b can be formed of a semiconductor doped with a different type of dopant from the type of dopant used for doping the first and second selection active regions (i.e., the first and second selection channel regions). Thus, the thresholds voltages of the first and second selection transistors can be decreased for high-speed operations. Alternatively, the first and second selection lower gates 110a and 110b can be formed of a semiconductor doped with the same type of dopant as the type of dopant used for doping the first and second selection active regions. In this case, the thresholds voltages of the first and second selection transistors can be determined by the thicknesses of the first and second selection gate insulation layers 105a and 105b and the amount of voltage increase caused by the first and second selection lower gates 110a and 110b.

A method of forming a nonvolatile memory device will now be described with reference to the accompanying drawings according to the embodiments of the present invention.

FIGS. 2 through 5 are cross-sectional views illustrating a method of forming a nonvolatile memory device according to an embodiment of the present invention.

Figure 2:
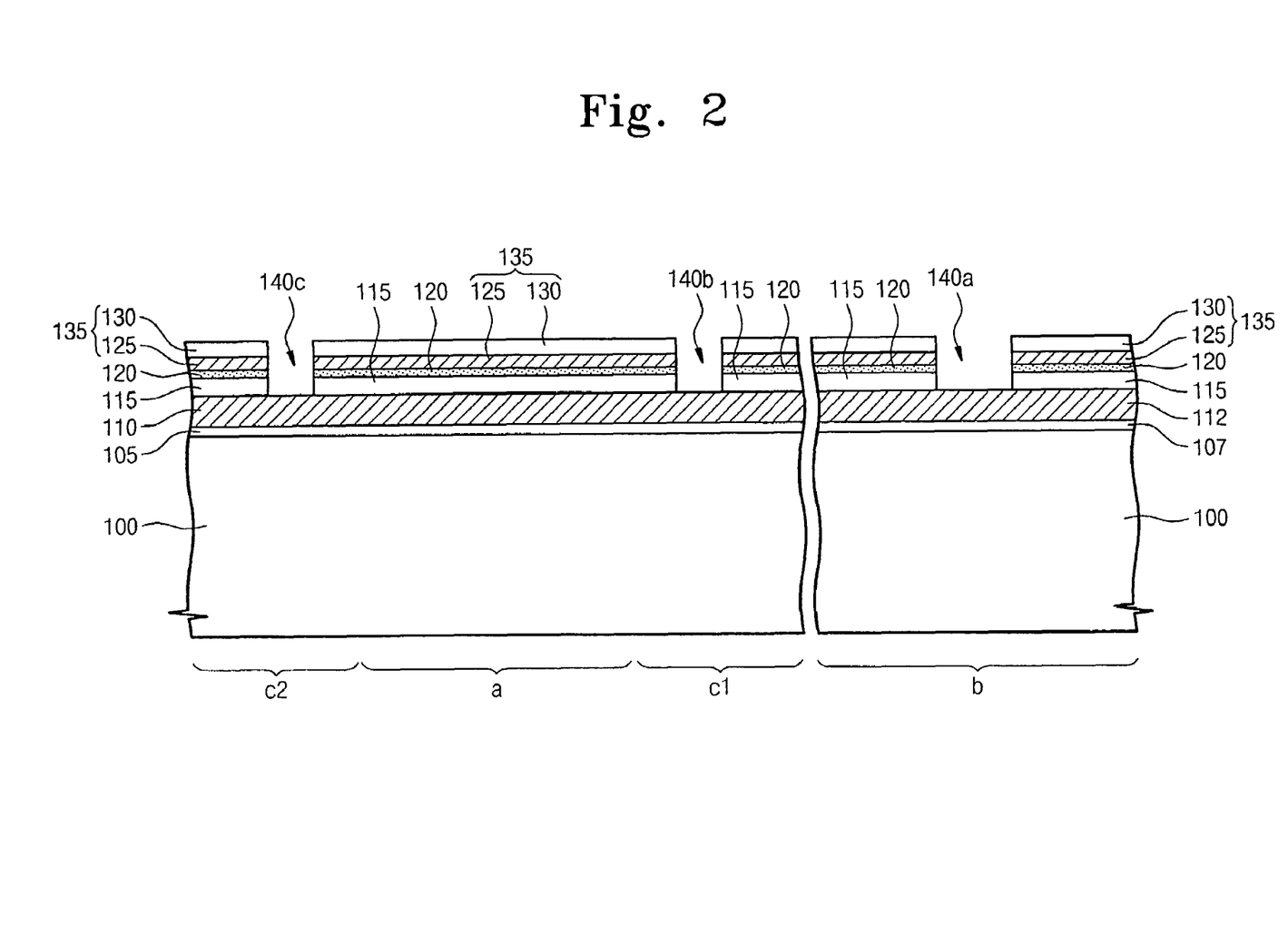
FIGS. 2 through 5 are cross-sectional views illustrating a method of forming a nonvolatile memory device according to an embodiment of the present invention.

Referring to FIG. 2, a substrate 100 includes a cell string region and a peripheral region (b), and a device isolation layer (not shown) is formed on the substrate 100 to define a string active region and a peripheral active region. The cell string region includes a cell region (a), and first and second selection regions (c1) and (c2) located beside the cell region (a). The string active region extends in a predetermined direction. The string active region includes a cell active region in the cell region (a), a first selection active region in the first selection region (c1), and a second selection active region in the second selection region (c2). The first and second selection active regions are respectively connected to both sides of the cell active region. The string active region and the peripheral active region are portions of the substrate 100 and are doped with a first-conductivity-type dopant. The string active region and the peripheral active region can be doped with the first-conductivity-type dopant by a well-forming process.

A string insulation layer 105 and a string semiconductor pattern 110 are sequentially formed on the string active region, and a peripheral insulation layer 107 and a peripheral semiconductor pattern 112 are sequentially formed on the peripheral active region. The string insulation layer 105 includes a tunnel insulation layer formed in the cell region (a), a first selection gate insulation layer formed in the first selection region (c1), and a second selection gate insulation layer formed in the second selection region (c2). The first and second selection gate insulation layers are in contact with both sides of the tunnel insulation layer, respectively, and are connected with each other. The string insulation layer 105 and the peripheral insulation layer 107 can be formed of a thermal oxide layer. The peripheral insulation layer 107 and the string insulation layer 105 can be different thicknesses or the same thickness.

The string semiconductor pattern 110 can be divided into a cell semiconductor pattern formed in the cell region (a), a first selection semiconductor pattern formed in the first selection region (c1), and a second selection semiconductor pattern formed in the second selection region (c2). The first and second selection semiconductor patterns are in contact with both sides of the cell semiconductor pattern and are connected with each other through the cell semiconductor pattern. The string semiconductor pattern 110 and the peripheral semiconductor pattern 112 may be formed of the same semiconductor material. The string semiconductor pattern 110 and the peripheral semiconductor pattern 112 may be doped with the first-conductivity-type dopant. That is, the string and peripheral semiconductor patterns 110 and 112 are doped with the same type of dopant as the dopant used for doping the string and peripheral active regions. The string and peripheral semiconductor patterns 110 and 112 can be formed by self-aligning using the device isolation layer (not shown). That is, the string and peripheral semiconductor patterns 110 and 112 can be formed as follows: a semiconductor layer is formed in a region surrounded by a portion of the device isolation layer protruded from the top surface of the substrate 100, and then the semiconductor layer is planarized until the device isolation layer is exposed. Alternatively, the string and peripheral semiconductor patterns 110 and 112 can be formed by depositing a semiconductor layer on the entire surface of the substrate 100 and patterning the semiconductor layer.

A blocking insulation layer 115, a diffusion barrier layer 120, and a mask layer 135 are sequentially formed on the entire surface of the substrate 100 including the string and peripheral semiconductor patterns 110 and 112. Next, the mask layer 135, the diffusion barrier layer 120, and the blocking insulation layer 115 are successively patterned so as to form a peripheral opening 140a, a first selection opening 140b, and a second selection opening 140c. The peripheral opening 140a exposes a predetermined region of the peripheral semiconductor pattern 112. The first selection opening 140b exposes a predetermined region of the first selection semiconductor pattern, and the second selection opening 140c exposes a predetermined region of the second selection semiconductor pattern.

The blocking insulation layer 115 can be formed of an oxide layer or an ONO layer to a thickness greater than that of the tunnel insulation layer. Alternatively, the blocking insulation layer 115 can include a high-k dielectric layer (e.g., an insulation metal oxide layer such as a hafnium oxide layer or a aluminum oxide layer) having a high dielectric constant as compared with the tunnel insulation layer. The diffusion barrier layer 120 is formed of a material that can prevent dopants from diffusing to the blocking insulation layer 115 and the string semiconductor pattern 110. For example, the diffusion barrier layer 120 can be formed of a nitride layer or an oxide-nitride layer. In some cases, the diffusion barrier layer 120 can be omitted.

The mask layer 135 can have a two-layer structure formed by sequentially stacking first and second layers 125 and 130 on the diffusion barrier layer 120. In this case, the second layer 130 can be formed of a material having an etch selectivity to the first layer 125, and the first layer 125 can be formed of a material having an etch selectivity to the diffusion barrier layer 120 and the blocking insulation layer 115. For example, the second layer 130 can be formed of a nitride layer, an oxide-nitride layer, an oxide layer, or a photoresist layer. The first layer 125 can be formed of a dopant-doped semiconductor. In case where the first layer 125 is formed of a dopant-doped semiconductor, a portion of the first layer 125 can be formed into a second gate electrode in a following process. Alternatively, the mask layer 135 can have a single-layer structure. In this case, the mask layer 135 can be formed of a photoresist layer.

Figure 3:
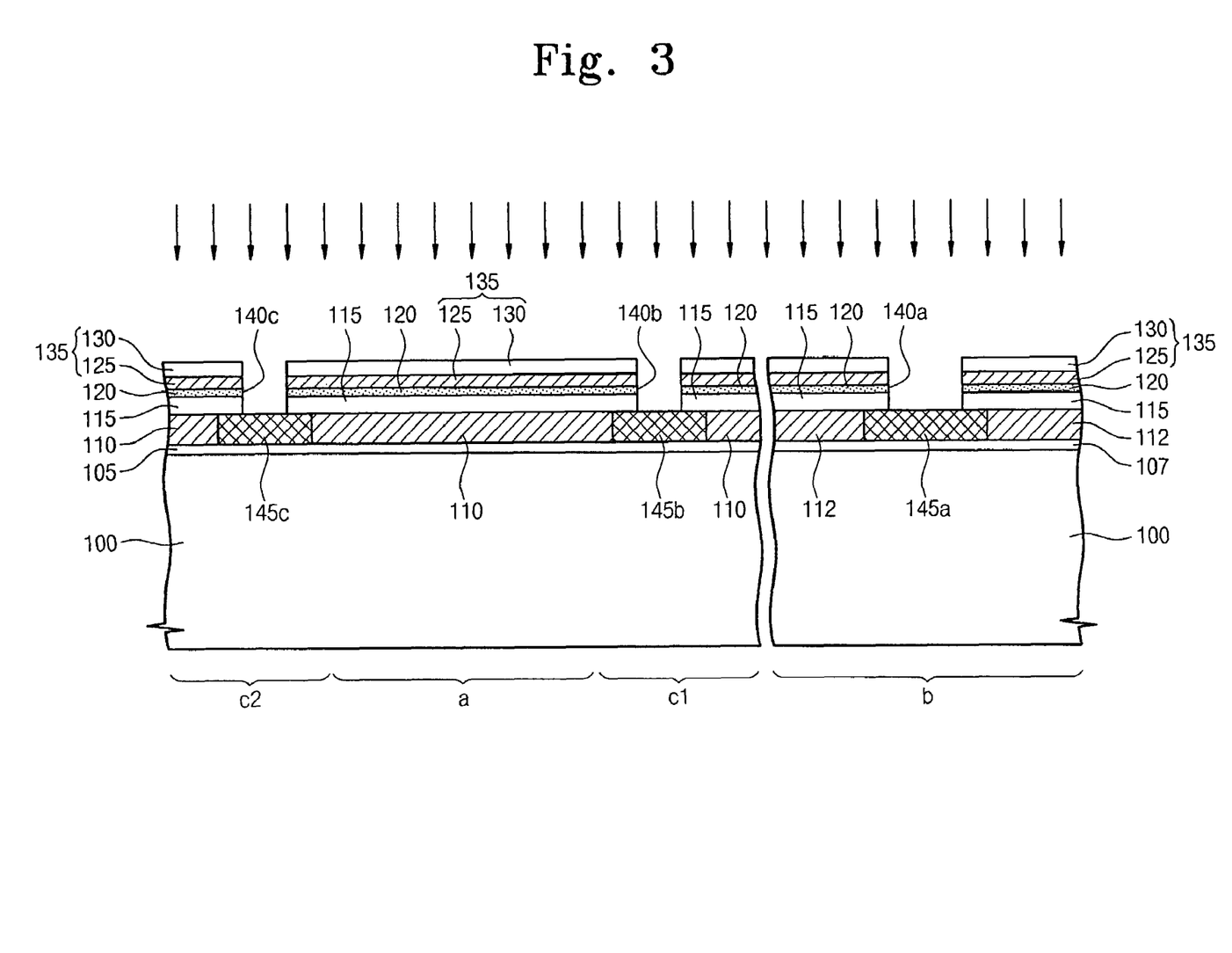

Referring to FIG. 3, the openings 140a, 140b, and 140c, which expose the string and peripheral semiconductor patterns 110 and 112, are used for a counter doping process. In detail, a second-conductivity-type dopant is injected into the exposed string and peripheral semiconductor patterns 110 and 112 using the mask layer 135 as a mask. As a result, first, second, and third counter-doped portions 145a, 145b, and 145c are formed. The first counter-doped portion 145a is doped with the second-conductivity-type dopant as a part of the peripheral semiconductor pattern 112. The first counter-doped portion 145a includes a region of the peripheral semiconductor pattern 112 exposed by the opening 140a. Here, the width of the first counter-doped portion 145a may be larger than that of the opening 140a. Similarly, the second and third counter-doped portions 145b and 145c include regions of the string semiconductor pattern 100 (i.e., regions of the first and second selection semiconductor patterns) exposed by the first and second selection openings 140b and 140c, respectively. The second and third counter-doped portions 145b and 145c are doped with the second-conductivity-type dopant. The second counter-doped portion 145b may be wider than the first selection opening 140b, and the third counter-doped portion 145c may be wider than the second selection opening 140c.

The first-conductivity-type dopant may be a p-type dopant, and the second-conductivity-type dopant may be an n-type dopant. Alternatively, the first-conductivity-type dopant can be an n-type dopant, and the second-conductivity-type dopant can be a p-type dopant.

Ion-implantation can be used for doping the exposed regions of the string and peripheral semiconductor patterns 110 and 112 with the second-conductivity-type dopant. That is, the second-conductivity-type dopant ions can be implanted into the substrate 100 using the mask layer 135 as a mask. Alternatively, plasma doping can be used for doping the exposed regions of the string and peripheral semiconductor patterns 110 and 112 with the second-conductivity-type dopant. In detail, after the second-conductivity-type dopant is activated into plasma, the second-conductivity-type dopant can be injected into the exposed regions of the string and peripheral semiconductor patterns 110 and 112. Alternatively, gas including the second-conductivity-type dopant can be thermally decomposed and diffused by a thermal decomposition/diffusion process so as to for doping the exposed regions of the string and peripheral semiconductor patterns 110 and 112. When the second-conductivity-type dopant is an n-type dopant, the thermal decomposition/diffusion process can be performed using $POCL_3$ or $PH_3$ gas.

When the counter-doped portions 145a, 145b, and 145c are formed by injecting the second-conductivity-type dopant, heat treatment can be performed. During the heat treatment, the second-conductivity-type dopant injected into the counter-doped portions 145a, 145b, and 145c can diffuse in the string and peripheral semiconductor patterns 110 and 112. Thus, the first, second, and third counter-doped portions 145a, 145b, and 145c can be wider than the peripheral opening 140a, the first selection opening 140b, and the second selection opening 140c, respectively. The heat treatment and the doping process using the second-conductivity-type dopant can be performed in situ. For example, when using the plasma doping or the thermal decomposition/diffusion, the injection of the second-conductivity-type dopant and the heat treatment can be performed in situ. When using the ion-implantation method, the heat treatment can be performed after the second-conductivity-type dopant is injected by the ion-implantation method.

When the mask layer 135 can sufficiently prevent the second-conductivity-type dopant from diffusing into the string semiconductor pattern 105 located in the cell region (a) (i.e., the cell semiconductor pattern) and into the blocking insulation layer 115, the diffusion barrier layer 120 can be omitted. On the contrary, when the diffusion layer 120 is formed, the mask layer 135 can be removed before the second-conductivity-type dopant is injected.

Figure 4:
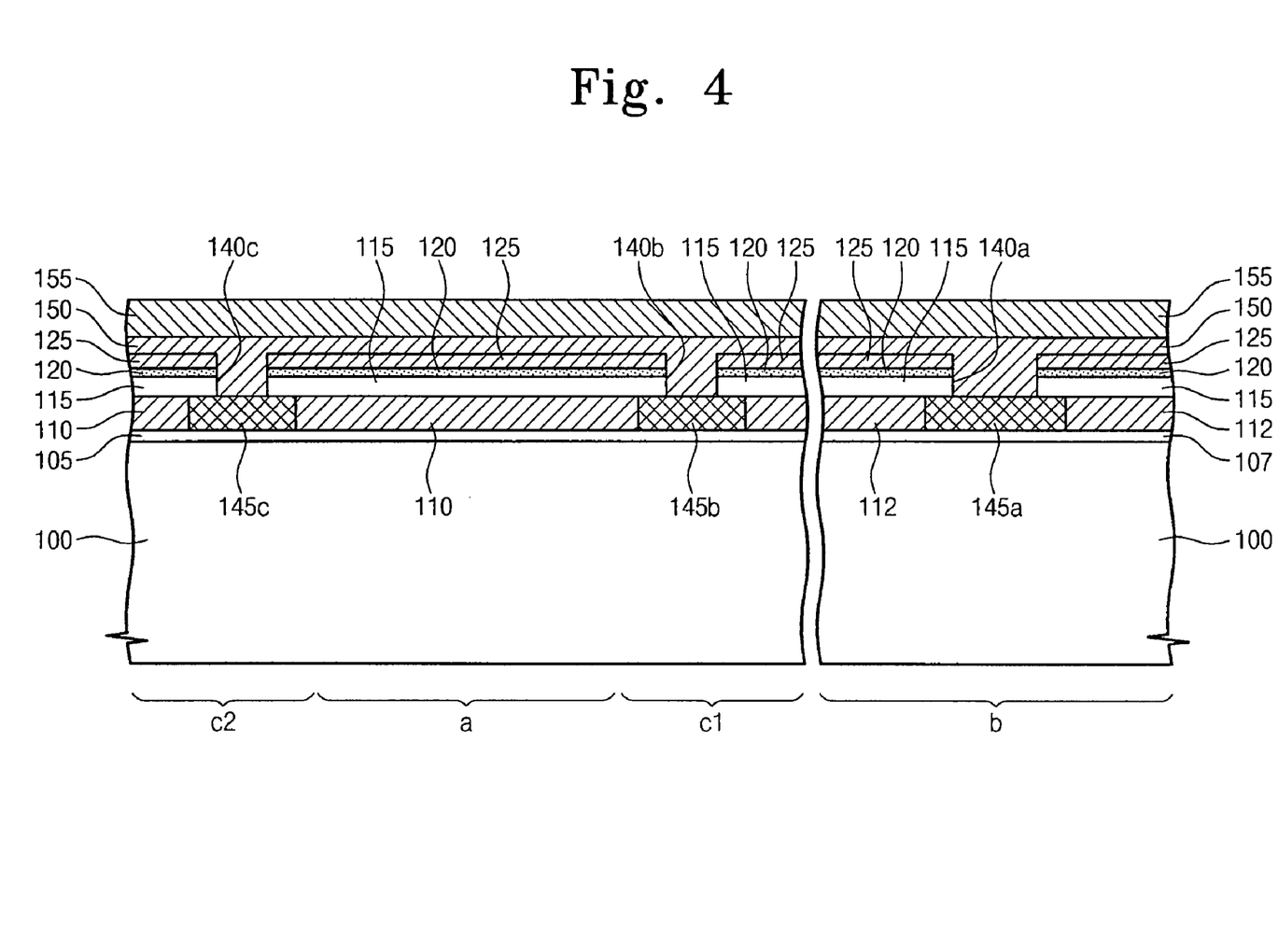

Referring to FIG. 4, the second layer 130 of the mask layer 135 is removed. When the mask layer 135 has a single-layer structure, the mask layer 135 can be completely removed. Although the mask layer 135 has a two-layer structure with the first and second layers 125 and 130, the mask layer 135 can be completely removed. In the current embodiment, the first layer 125 is not removed. In this case, the first layer 125 may be formed of a semiconductor doped with the second-conductivity-type dopant like the counter-doped portions 145a, 145b, and 145c.

A control gate semiconductor layer 150 is formed on an entire surface of the substrate 100 so as to fill the openings 140a, 140b, and 140c. The control gate semiconductor layer 150 makes contact with the counter-doped portions 145a, 145b, and 145c. The control gate semiconductor layer 150 may be formed of a semiconductor doped with the second-conductivity-type dopant.

A low-resistance conductive layer 155 is formed on the control gate semiconductor layer 150. The low-resistance conductive layer 155 may be formed of a conductive material having a resistance lower than the control gate semiconductor layer 150. For example, the low-resistance conductive layer 155 can be formed of a metal, a conductive metal nitride, or a metal silicide. For example, the low-resistance conductive layer 155 can be formed of at least one material selected from the group consisting of tungsten, molybdenum, nitride titanium, nitride tantalum, and tungsten silicide.

Figure 5:
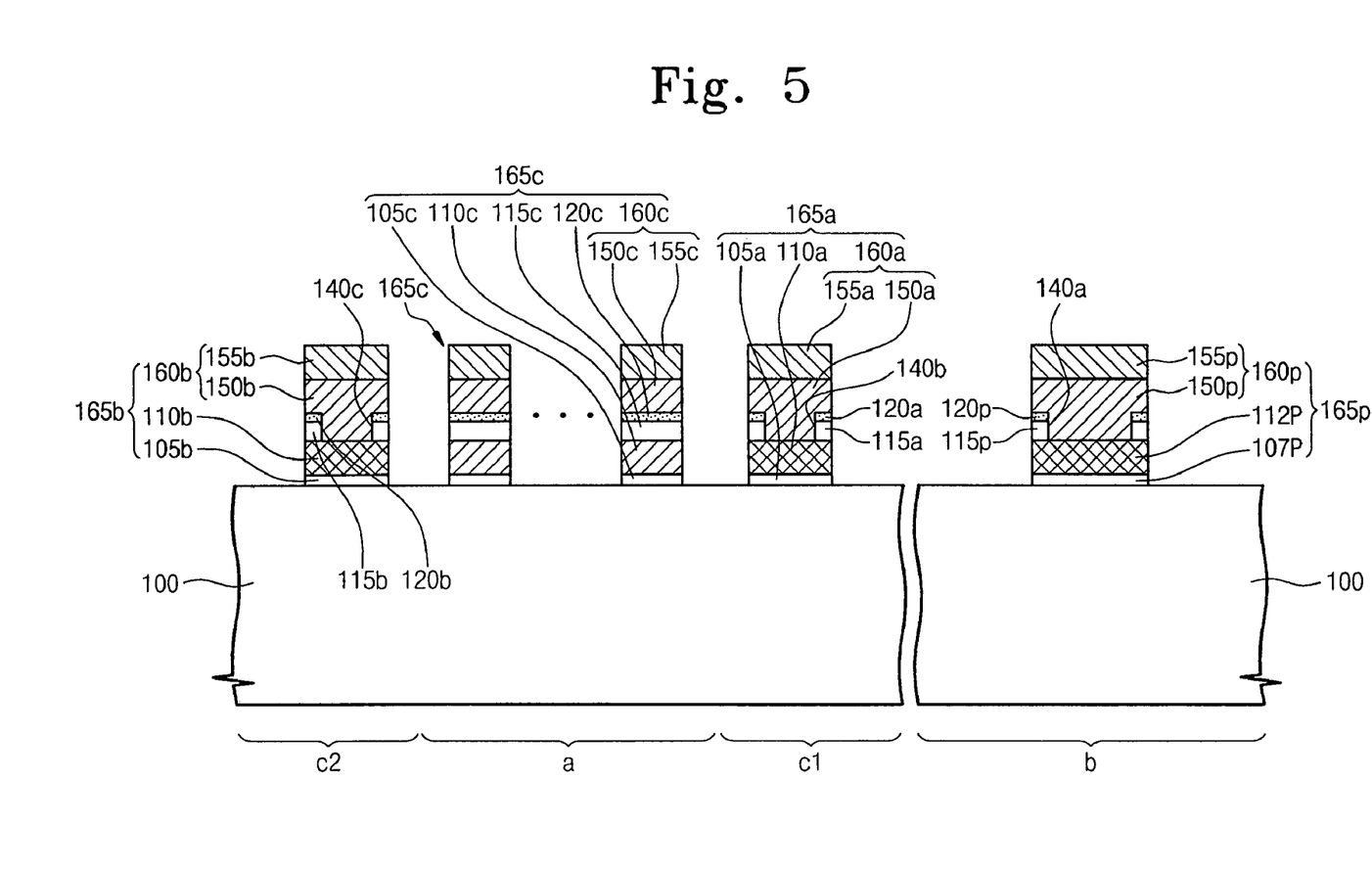

Referring to FIG. 5, the low-resistance conductive layer 155, the control gate semiconductor layer 150, the diffusion barrier layer 120, the blocking insulation layer 115, the string semiconductor pattern 110, and the string insulation layer 105 are sequentially patterned so as to form a first selection gate pattern 165a, a plurality of cell gate patterns 165c, and a second selection gate pattern 165b in the cell string region (a, c1, c2) at predetermined intervals. In the peripheral region (b), the low-resistance conductive layer 155, the control gate semiconductor layer 150, the diffusion barrier layer 120, the blocking insulation layer 115, the peripheral semiconductor pattern 112, and the peripheral insulation layer 107 are sequentially patterned so as to form a peripheral gate pattern 165p on the peripheral active region. The structures of the cell, first selection, second selection, and peripheral gate patterns 165c, 165a, 165b, and 165p are already described with reference to FIG. 1. Thus, descriptions of the structures will be omitted. The gate patterns 165c, 165a, 165b, and 165p may be simultaneously formed.

Floating gates 110c are formed from the string semiconductor pattern 110 located in the cell region (a), and a peripheral lower gate 112p is formed from the first counter-doped portion 145a. First and second selection lower gates 110a and 110b are respectively formed from the second and third counter-doped portions 145b and 145c. Peripheral, first selection, and second selection inter-gate patterns 115p, 115a, and 115b and a blocking insulation pattern 115c are formed from the blocking insulation layer 115. First patterns 150a, 150b, 150c, and 150p are formed from the control gate semiconductor layer 150, and second patterns 155a, 155b, 155c, and 155p are formed from the low-resistance conductive layer 155.

The cell, first selection, and second selection gate patterns 165c, 165a, and 165b are used as masks to implant a second-conductivity-type dopant ions in the string active region so as to form first dopant doped regions 170c, 170s, and 170d as shown in FIG. 1, and the peripheral gate pattern 165p is used as a mask to implant a second-conductivity-type dopant ions so as to form a second dopant doped region 170p as shown in FIG. 1. The first dopant doped regions 170c, 170s, and 170d can be formed simultaneously with the second dopant doped region 170p. Alternatively, the first dopant doped regions 170c, 170s, and 170d and the second dopant doped region 170p can be sequentially formed.

A counter doping method for some portions of the string semiconductor pattern 110 and the peripheral semiconductor pattern 112 will now be described in detail with reference to FIGS. 6 and 7 according to another embodiment of the present invention. The counter doping method of the current embodiment can include the processes described in connection with FIG. 2.

Figure 6:
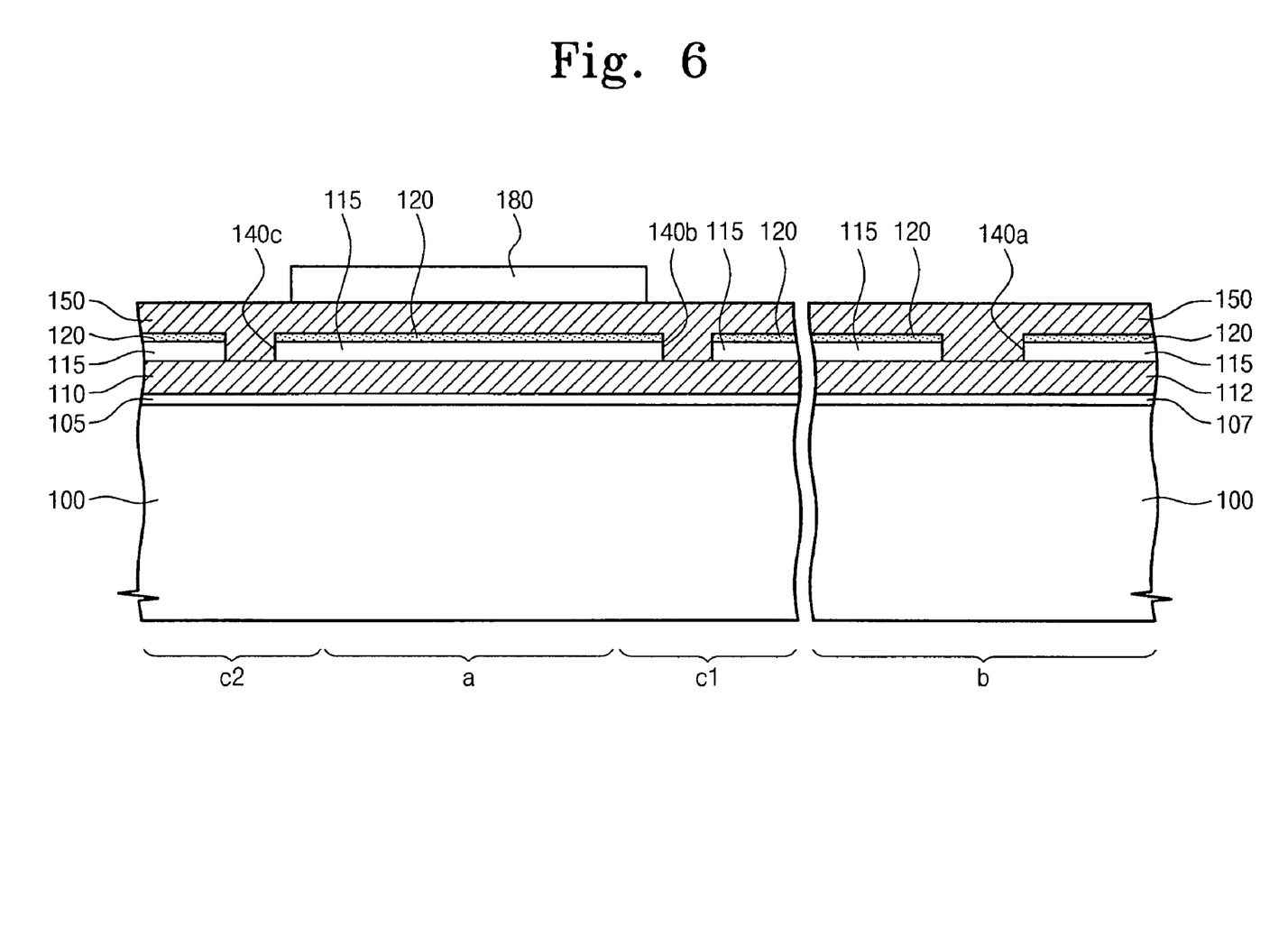
FIGS. 6 and 7 are cross-sectional views illustrating a method of forming a nonvolatile memory device according to another embodiment of the present invention.
Figure 7:
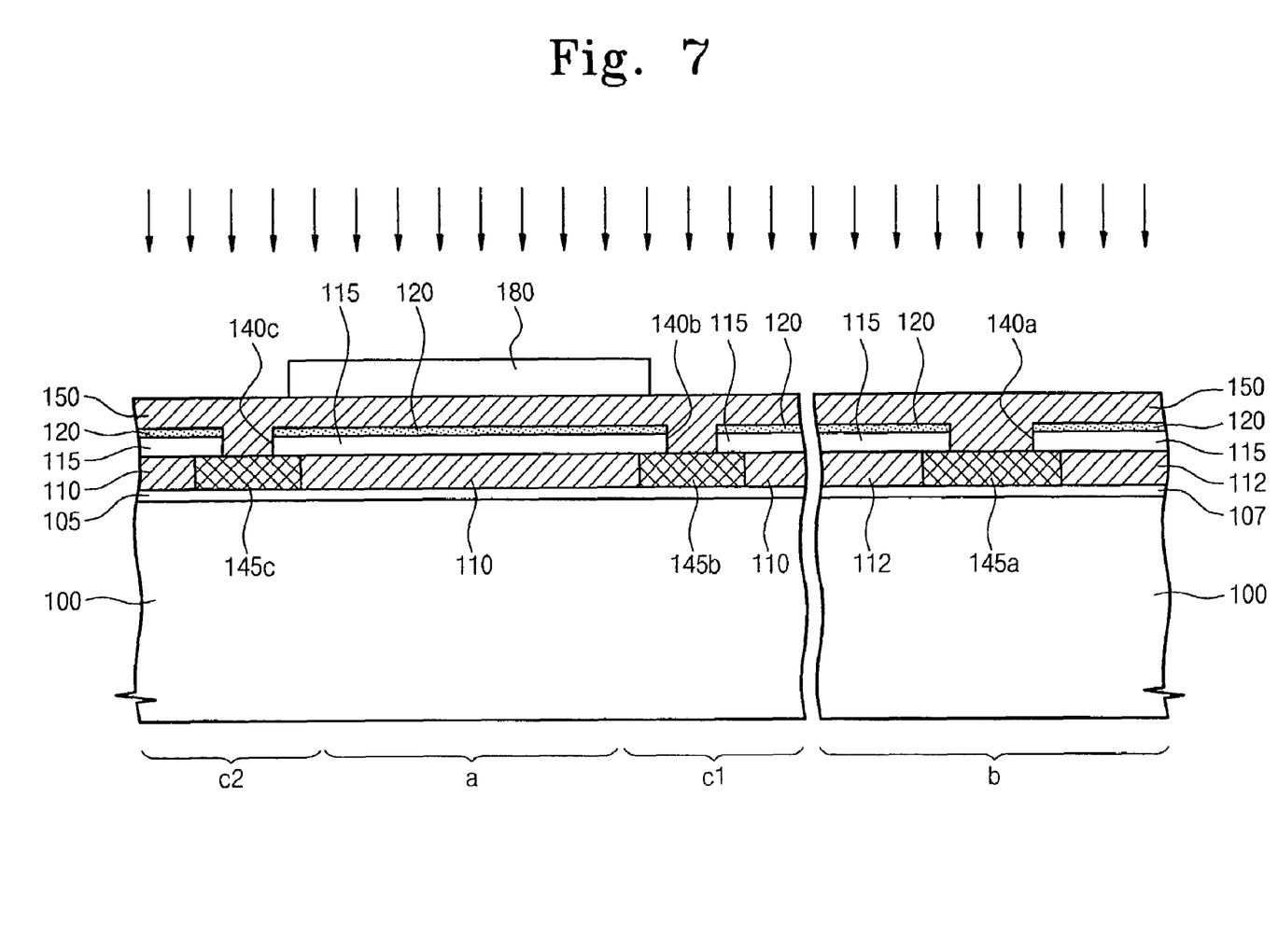

FIGS. 6 and 7 are cross-sectional views illustrating a method of forming a nonvolatile memory device according to another embodiment of the present invention.

Referring to FIGS. 2 and 6, a mask layer 135 is removed after forming peripheral, first selection, and second selection openings 140a, 140b, and 140c. As described above, when the mask layer 135 has a two-layer structure having first and second layers 125 and 130 and the first layer 125 is formed of a semiconductor doped with a first-conductivity-type dopant, the first layer 125 can remain. In the current embodiment, the mask layer 135 is completely removed.

A control gate semiconductor layer 150 is formed on an entire surface of a substrate 100 so as to fill the openings 140a, 140b, and 140c. Here, the control gate semiconductor layer 150 is formed of a semiconductor doped with the first-conductivity-type dopant.

A mask pattern 180 is formed on the substrate 100. The mask pattern 180 is located on the control gate semiconductor layer 150 in a cell region (a). That is, some portion of the control gate semiconductor layer 150 located in the cell region (a) is covered with the mask pattern 180, and the other portion of the control gate semiconductor layer 150 located in first and second selection regions (c1) and (c2) and peripheral region (b) are exposed. The mask pattern 180 can be formed of a photoresist layer, a nitride layer, or an oxide layer.

Referring to FIG. 7, second-conductivity-type dopants are injected into the exposed portion of the control gate semiconductor layer 150, and into portions of a string semiconductor pattern 100 and a peripheral semiconductor pattern 112 through the openings 140a, 140b, and 140c, to perform a counter doping. As a result, the exposed portion of the control gate semiconductor pattern 150 is counter doped with the second-conductivity-type dopant. Further, counter-doped regions 145a, 145b, and 145c are formed under the openings 140a, 140b, and 140c. During the counter doping, heat treatment may be performed. The injection of the second-conductivity-type dopant and the heat treatment can be performed in situ or sequentially.

The injection of the second-conductivity-type dopant can be performed using an ion-implantation method or plasma doping method. Further, the injection of the second-conductivity-type dopant can be performed by a thermal decomposition/diffusion method using gas including the second-conductivity-type dopant.

Next, the mask pattern 180 is removed, and a low-resistance conductive layer 155 is formed on the entire surface of the substrate 100 as shown in FIG. 4. The remaining processes can be performed in the same manner as explained in FIG. 5.

The mask pattern 180 can further cover the control gate semiconductor layer 150. That is, the mask pattern 180 can cover portions of the control gate semiconductor layer 150 located in the first and second selection regions (c1) and (c2). In this case, portions of the control gate semiconductor layer 150 and the string semiconductor pattern 110 located in the first and second selection regions (c1) and (c2) can be kept in a first type dopant doped state. Therefore, first and second selection lower gates 110a and 110b can be doped with the first type dopant as illustrated in FIG. 1.

A counter doping method will now be described in detail with reference to FIGS. 8 and 9 according to another embodiment of the present invention. The counter doping method of the current embodiment can include the processes described in connection with FIG. 2.

Figure 8:
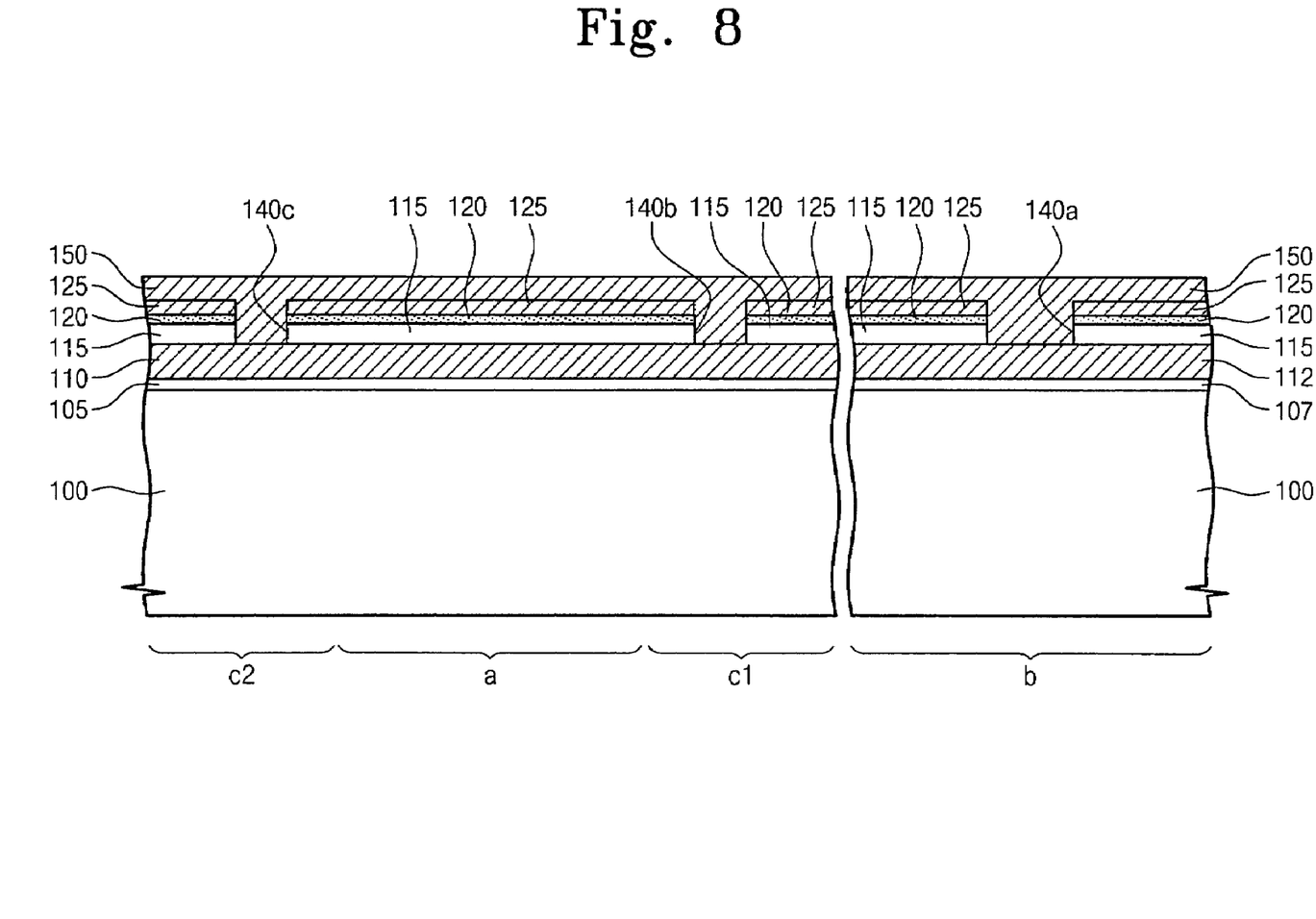
FIGS. 8 and 9 are cross-sectional views illustrating a method of forming a nonvolatile memory device according to another embodiment of the present invention.
Figure 9:
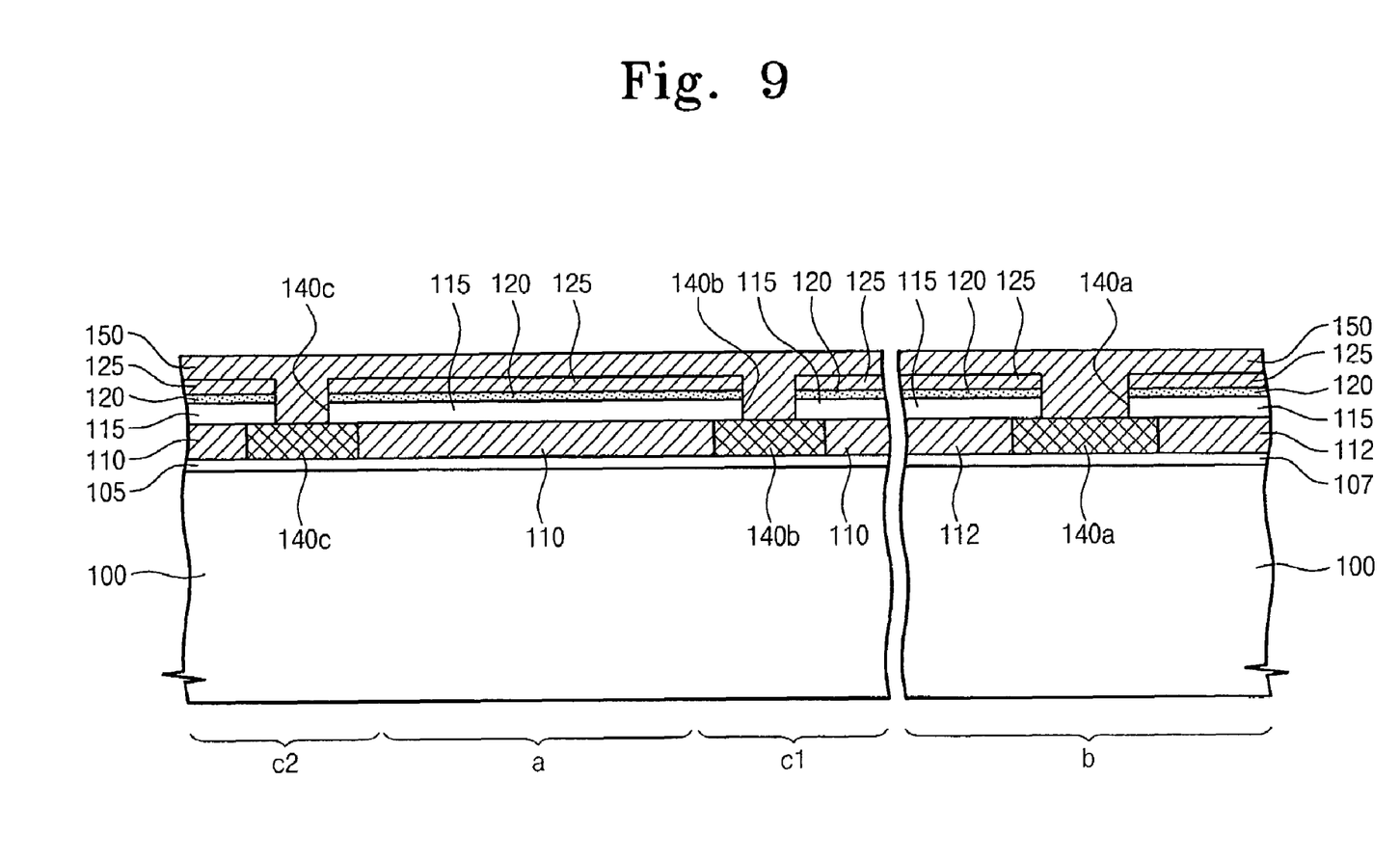

FIGS. 8 and 9 are cross-sectional views illustrating a method of forming a nonvolatile memory device according to another embodiment of the present invention.

Referring to FIGS. 2 and 8, at least a portion of a mask layer 135 is removed after forming openings 140a, 140b, and 140c. The mask layer 135 can be completely removed. Alternatively, when the mask layer 135 has a two-layer structure having first and second layers 125 and 130 and the first layer 125 is formed of a semiconductor doped with a second-conductivity-type dopant, the first layer 125 can remain. In the current embodiment, the second layer 130 is removed, and the first layer 125 remains.

A control gate semiconductor layer 150 is formed on an entire surface of a substrate 100 including the remaining first layer 125 so as to fill the openings 140a, 140b, and 140c. Here, the control gate semiconductor layer 150 is formed of a semiconductor doped with a second-conductivity-type dopant. The control gate semiconductor layer 150 is in contact with a string semiconductor pattern 110 and a peripheral semiconductor pattern 112 via the openings 140a, 140b, and 140c. The control gate semiconductor pattern 150 may be doped with a dopant to a high concentration.

Referring to FIG. 9, the substrate 100 is heat treated so as to allow the second-conductivity-type dopant to diffuse into the string and peripheral semiconductor patterns 110 and 112 through the openings 140a, 140b, and 140c. As a result, first, second, and third counter-doped portions 145a, 145b, and 145c can be formed under the openings 140a, 140b, and 140c.

Then, a low-resistance conductive layer 150 is formed as shown in FIG. 4. The remaining processes can be performed in the same manner as described in connection with FIG. 5.

In the above-described embodiments of the present invention, the nonvolatile memory device is a NAND type nonvolatile memory device. However, the present invention is not limited to the NAND type nonvolatile memory device. That is, the present invention can be applied to various nonvolatile memory devices having semiconductor floating gate such as a NOR type nonvolatile memory device.

As described above, according to the present invention, the floating gate doped with a first-conductivity-type dopant is formed on the first active region doped with the first-conductivity-type dopant. Accordingly, the thickness of the tunnel insulation layer can be kept thin, and as well the threshold voltage of a nonvolatile memory cell having the floating gate can be increased. As a result, the durability of the tunnel insulation layer increases since the thickness of the tunnel insulation layer can be kept thin, and the data retention characteristic of the nonvolatile memory cell can be increased owing to the increase in the threshold voltage, thereby realizing a nonvolatile memory device having good characteristics at a high temperature as well as room temperature.

Furthermore, the lower gate of the peripheral circuit transistor and/or the selection transistor is formed on the second active region doped with a first-conductivity-type dopant, and the lower gate is formed of a semiconductor doped with a second-conductivity-type dopant. Therefore, the threshold voltage of the peripheral circuit transistor and/or the selection transistor can be kept at a lower level. As a result, the peripheral circuit transistor and/or the selection transistor can operate at a high speed, thereby realizing a high-speed nonvolatile memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a nonvolatile memory device, comprising:
    defining first and second active regions respectively in first and second regions of a substrate, the first and second active regions doped with a first-conductivity-type dopant;
    forming a first insulation layer and a first semiconductor pattern stacked on the first active region, and a second insulation layer and a second semiconductor pattern stacked on the second active region, the first semiconductor pattern being doped with the first-conductivity-type dopant, the second semiconductor pattern being doped with the first-conductivity-type dopant;
    forming a blocking insulation layer on a surface of the substrate;
    patterning the blocking insulation layer to form an opening exposing the second semiconductor pattern;
    counter doping a portion of the second semiconductor pattern with a second-conductivity-type dopant through the opening;
    forming a control gate conductive layer so as to cover the surface of the substrate and fill the opening; and
    after the counter doping, forming a floating gate, a blocking insulation pattern and a control gate electrode stacked on the first active region, and a lower gate, an inter-gate pattern having the opening, and an upper gate stacked on the second active region,
    wherein the floating gate is formed from a portion of the first semiconductor pattern, and the lower gate is formed from the portion of the second semiconductor pattern counter doped with the second-conductivity-type dopant.

2. The method of claim 1, wherein the first-conductivity-type dopant is a p-type dopant, and the second-conductivity-type dopant is an n-type dopant.

3. The method of claim 1, further comprising forming a diffusion barrier layer on the blocking insulation layer prior to the patterning of the blocking insulation layer, wherein the opening passes through the diffusion barrier layer and the blocking insulation layer.

4. The method of claim 1, wherein the counter doping and the forming of the control gate conductive layer comprise:
    injecting a second-conductivity-type dopant into a portion of the second semiconductor pattern exposed by the opening to perform the counter doping; and
    forming a control gate conductive layer on a surface of the substrate, the control gate conductive layer contacting the counter-doped portion of the second semiconductor pattern through the opening,
    wherein the second-conductivity-type dopant is injected using one of ion-implantation, plasma doping, and thermal decomposition/diffusion, the thermal decomposition/diffusion being performed by thermally decomposing and diffusing gas containing a dopant.

5. The method of claim 1, wherein the patterning of the blocking insulation layer to form the opening comprises:
- forming a mask layer including first and second layers that are sequentially stacked on the blocking insulation layer; and
- sequentially patterning the mask layer and the blocking insulation layer so as to form an opening,
- wherein the first layer of the mask layer is a semiconductor layer, and the control gate electrode and the upper gate include portions of the first layer of the mask layer, respectively.

6. The method of claim 1, wherein the second active region is connected to one side of the first active region to form a string active region together with the first active region;
- the first and second insulation layers are transversely connected with each other, and the first and second semiconductor patterns are transversely connected with each other;
- the floating gate, the blocking insulation pattern, and the control gate electrode are included in a cell gate pattern, and a plurality of the cell gate patterns are formed side by side at regular intervals on the first active region; and
- the lower gate and the upper gate are included in a selection gate pattern.

7. The method of claim 6, further comprising implanting second-conductivity-type dopant ions into the string active region using the cell gate patterns and the selection gate pattern as a mask.

8. The method of claim 1, wherein the first region is a region for nonvolatile memory cells, and the second region is a region for a peripheral circuit transistor, the method further comprising:
- defining a third active region in a third region of the substrate, the third active region being connected to one side of the first active region; and
- forming a selection gate insulation layer, a selection lower gate, a selection inter-gate pattern having a selection opening, and a selection upper gate that are sequentially stacked on the third active region,
- wherein the first and third active regions form a string active region, and the selection upper gate is connected to the lower gate through the selection opening.

9. The method of claim 8, wherein the selection lower gate is formed of a semiconductor doped with the first-conductivity-type dopant.

10. The method of claim 8, wherein the selection lower gate is formed of a semiconductor doped with the second-conductivity-type dopant.

11. The method of claim 8, further comprising:
- implanting second-conductivity-type dopant ions into the string active region using the control gate electrode and the selection upper gate as a mask; and
- implanting second-conductivity-type dopant ions into the second active region using the upper gate of the second region as a mask.

12. The method of claim 1, wherein the counter doping and the forming of the control gate conductive layer comprise:
- forming a control gate semiconductor layer doped with the first-conductivity-type dopant to cover a surface of the substrate and fill the opening;
- forming a mask pattern on the control gate semiconductor layer, the mask pattern covering a portion of the control gate semiconductor layer located on the first active region and exposing another portion of the control gate semiconductor layer located in the second region of the substrate; and
- counter doping the exposed portion of the control gate semiconductor layer and a portion of the second semiconductor pattern located under the opening with the second-conductivity-type dopant using the mask pattern as a mask,
- wherein the second-conductivity-type dopant is injected using one of ion-implantation, plasma doping, and thermal decomposition/diffusion, the thermal decomposition/diffusion being performed by thermally decomposing and diffusing gas containing a dopant.

13. The method of claim 1, wherein the counter doping and the forming of the control gate conductive layer comprise:
- forming a control gate semiconductor layer on a surface of the substrate, the control gate semiconductor layer being doped with the second-conductivity-type dopant and making contact with the second semiconductor pattern through the opening; and
- heat treating the substrate to diffuse the second-conductivity-type dopant from the control gate semiconductor layer to the second semiconductor pattern through the opening so as to counter dope the second semiconductor pattern.

* * * * *